United States Patent
Wann et al.

(10) Patent No.: US 9,184,050 B2
(45) Date of Patent: Nov. 10, 2015

(54) INVERTED TRAPEZOIDAL RECESS FOR EPITAXIAL GROWTH

(75) Inventors: Clement Hsingjen Wann, Carmel, NY (US); Chih-Hsin Ko, Fongshan (TW); Cheng-Hsien Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 547 days.

(21) Appl. No.: 12/847,877

(22) Filed: Jul. 30, 2010

(65) Prior Publication Data
US 2012/0025201 A1   Feb. 2, 2012

(51) Int. Cl.
| H01L 21/20 | (2006.01) |
|---|---|
| H01L 21/02 | (2006.01) |
| H01L 21/762 | (2006.01) |
| H01L 29/04 | (2006.01) |
| H01L 29/06 | (2006.01) |

(52) U.S. Cl.
CPC ........ H01L 21/0254 (2013.01); H01L 21/0243 (2013.01); H01L 21/0262 (2013.01); H01L 21/02381 (2013.01); H01L 21/02433 (2013.01); H01L 21/02458 (2013.01); H01L 21/02639 (2013.01); *H01L 21/76224* (2013.01); *H01L 29/045* (2013.01); *H01L 29/0657* (2013.01)

(58) Field of Classification Search
CPC ............... H01L 21/02428; H01L 21/02433; H01L 21/2018; H01L 21/02381; H01L 21/0243; H01L 21/02458; H01L 21/0254; H01L 21/0262; H01L 21/02639; H01L 21/76224; H01L 29/045; H01L 29/0657
USPC ............ 438/700, 429, 413, 442; 257/E21.09, 257/615, 76; 8/700
See application file for complete search history.

(56) References Cited

U.S. PATENT DOCUMENTS

| 5,770,884 | A * | 6/1998 | Pogge et al. | 257/506 |
|---|---|---|---|---|
| 5,866,443 | A | 2/1999 | Pogge et al. | |
| 7,279,377 | B2 * | 10/2007 | Rueger et al. | 438/222 |
| 7,626,246 | B2 * | 12/2009 | Lochtefeld et al. | 257/647 |

(Continued)

FOREIGN PATENT DOCUMENTS

CN      1929139 A      3/2007

OTHER PUBLICATIONS

Sato, K., et al., "Characterization of Orientation-Dependent Etching Properties of Single-Crystal Silicon: Effects of KOH Concentration," Sensors and Actuators A: Physical, Tenth IEEE International Workshop on Micro Electro Mechanical Systems, Jan. 1, 1998, pp. 87-93, vol. 64, Issue 1, Elsevier Science S.A.

(Continued)

*Primary Examiner* — Ermias Woldegeorgis
*Assistant Examiner* — Benjamin Tzu-Hung Liu
(74) *Attorney, Agent, or Firm* — Slater & Matsil, L.L.P.

(57) ABSTRACT

A semiconductor device having an epitaxial layer a method of manufacture thereof is provided. The semiconductor device has a substrate with a trench formed therein and a recess formed below the trench. The recess has sidewalls with a (111) crystal orientation. The depth of the trench is such that the depth is greater than or equal to one-half a length of sidewalls of the recess. An epitaxial layer is formed in the recess and the trench. The depth of the trench is sufficient to cause dislocations formed between the interface of the semiconductor substrate and the epitaxial layer to terminate along sidewalls of the trench.

20 Claims, 3 Drawing Sheets

(56) References Cited

U.S. PATENT DOCUMENTS

| | | | |
|---|---|---|---|
| 7,951,657 B2 * | 5/2011 | Cheng et al. | 438/151 |
| 8,022,412 B2 * | 9/2011 | Wuu et al. | 257/76 |
| 8,236,698 B2 * | 8/2012 | Barbe et al. | 438/700 |
| 8,283,226 B2 * | 10/2012 | Fukuda et al. | 438/218 |
| 8,435,702 B2 * | 5/2013 | Terasawa et al. | 430/5 |
| 2004/0183078 A1 * | 9/2004 | Wang | 257/74 |
| 2006/0006477 A1 | 1/2006 | Hashimi et al. | |
| 2006/0169987 A1 | 8/2006 | Miura et al. | |
| 2006/0292834 A1 * | 12/2006 | Lin et al. | 438/478 |
| 2007/0052027 A1 * | 3/2007 | Ke et al. | 257/351 |
| 2007/0267722 A1 * | 11/2007 | Lochtefeld et al. | 257/618 |
| 2008/0237634 A1 * | 10/2008 | Dyer et al. | 257/190 |
| 2009/0039361 A1 * | 2/2009 | Li et al. | 257/94 |
| 2010/0187635 A1 * | 7/2010 | Beyer et al. | 257/369 |

OTHER PUBLICATIONS

Sato, K., et al., "Anisotropic Etching Rates of Single-Crystal Silicon for TMAH Water Solution as a Function of Crystallographic Orientation," Sensors and Actuators A: Physical, Mar. 9, 1999, pp. 131-137, vol. 73, Issues 1-2, Elsevier Science S.A.

Seidel, H., et al., "Anisotropic Etching of Crystalline Silicon in Alkaline Solutions," Journal of the Electrochemical Society, Solid-State Science and Technology Technical Papers, Nov. 1990, pp. 3612-3626, vol. 137, No. 11, The Electrochemical Society, Inc.

Tanaka, S., et al., "Defect Structure in Selective Area Growth GaN Pyramid on (111)Si Substrate," Applied Physics Letters, May 8, 2000, pp. 2701-2703, vol. 76, No. 19, American Institute of Physics.

Zubel, I., et al., "Silicon Anisotropic Etching in Alkaline Solutions IV: The Effect of Organic and Inorganic Agents on Silicon Anisotropic Etching Process," Sensors and Actuators A: Physical, Jan. 5, 2001, pp. 163-171, vol. 87, Issue 3, Elsevier Science S.A.

"Wet-Chemical Etching and Cleaning of Silicon," Virginia Semiconductor, Inc., Jan. 2003, 11 pages, Fredericksburg, Virgina, United States.

Hiramatsu, K., et al., "Fabrication and Characterization of Low Defect Density GaN Using Facet-Controlled Epitaxial Lateral Overgrowth (FACELO)," Journal of Crystal Growth 221 (2000), pp. 316-326.

* cited by examiner

INVERTED TRAPEZOIDAL RECESS FOR EPITAXIAL GROWTH

TECHNICAL FIELD

This disclosure relates generally to semiconductor devices and, more specifically, to the use of an inverted trapezoidal recess for epitaxial growth.

BACKGROUND

Performance of semiconductor devices may often be increased by epitaxially growing other materials, such as group III-V materials, on a semiconductor substrate. The difference in the lattice structure between the epitaxial material and the semiconductor substrate causes a stress in the epitaxial layer. This stress in the epitaxial layer may improve the speed and performance of integrated circuits. For example, to further enhance transistor performance, transistors have been fabricated using strained channel regions located in portions of a semiconductor substrate. Strained channel regions allow enhanced carrier mobility to be realized, thereby resulting in increased performance when used for n-channel or for p-channel devices. Generally, it is desirable to induce a tensile strain in the channel region of an n-channel transistor in the source-to-drain direction to increase electron mobility and to induce a compressive strain in the channel region of a p-channel transistor in the source-to-drain direction to increase hole mobility.

During the epitaxial growth process, however, dislocations form in the interface between the epitaxial layer and the semiconductor material due to the difference in the lattice structures of the different materials. These dislocations extend from the interface through the epitaxial layer. In some instances, the dislocations may extend to a surface of the epitaxial layer. In situations such as these in which the dislocations extend to or near the surface, the dislocations may adversely affect the performance of the devices formed therein.

SUMMARY

These and other problems are generally reduced, solved, or circumvented, and technical advantages are generally achieved, by embodiments discussed herein, which provide an inverted trapezoidal recess for epitaxial growth.

In an embodiment, a semiconductor device having an inverted trapezoidal recess is provided. A trench is formed in the semiconductor substrate and a recess is formed along the bottom of the trench such that sidewalls of the recess have a (111) crystal orientation. Sidewalls of the trenches may be formed of a different material than the semiconductor substrate, such as a dielectric material. A depth of the trench is such that a ratio of the depth of the trench to a length of the sidewalls of the inverted trapezoidal recess is equal to or greater than 0.5.

In another embodiment, a method of forming a semiconductor device having an inverted trapezoidal recess is provided. The method includes performing a first etch process to recess the substrate a first distance, thereby forming a trench. A second etch process is performed to recess the bottom of the trench such that sidewalls of the recess have (111) crystal orientations. A depth of the trench is at least one-half a length of the sidewalls of the recess.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use embodiments, and do not limit the scope of this disclosure.

Figure 1:
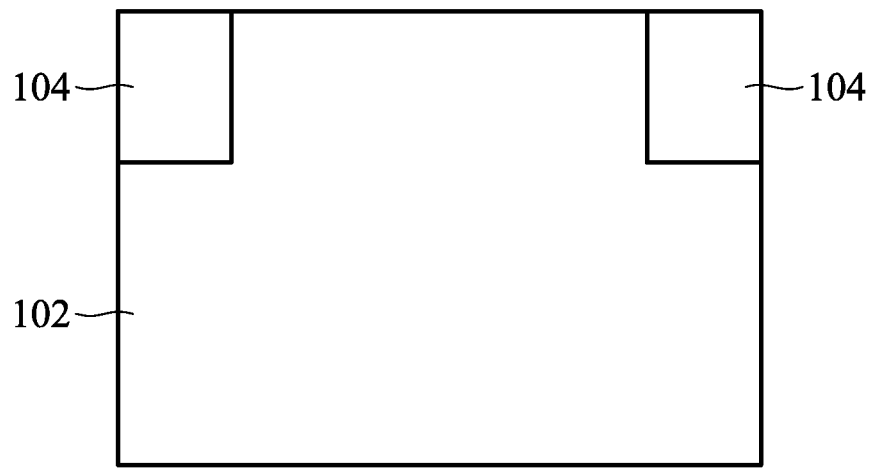
FIGS. 1-4 illustrate intermediate stages of forming a semiconductor device having an inverted trapezoidal recess in accordance with an embodiment.

FIG. 1 illustrates a substrate 102 having isolation regions 104 formed therein in accordance with an embodiment. The substrate 102 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The isolation regions 104 may be formed by first forming trenches and then filling the trenches with a dielectric material. In an embodiment, a patterned mask (not shown), such as a photoresist mask and/or a hard mask, is formed on the substrate 102 using deposition and photolithography techniques. Thereafter, an etching process, such as a reactive ion etch (RIE) or other dry etch, an anisotropic wet etch, or any other suitable anisotropic etch or patterning process, is performed to form trenches in the substrate 102.

Once formed, the trenches are filled with a dielectric material thereby forming the isolation regions 104 as illustrated in FIG. 1. The dielectric material may comprise, for example, a thermal oxidation, a chemical vapor deposition (CVD) silicon oxide, or the like. It may also comprise a combination of materials, such as silicon nitride, silicon oxy-nitride, high-k dielectrics, low-k dielectrics, CVD poly-silicon, or other dielectrics. A planarization process, such as a chemical mechanical polish (CMP) or etch back step, may be performed to planarize an upper surface of the dielectric material and an upper surface of the substrate 102 as illustrated in FIG. 1.

Figure 2:
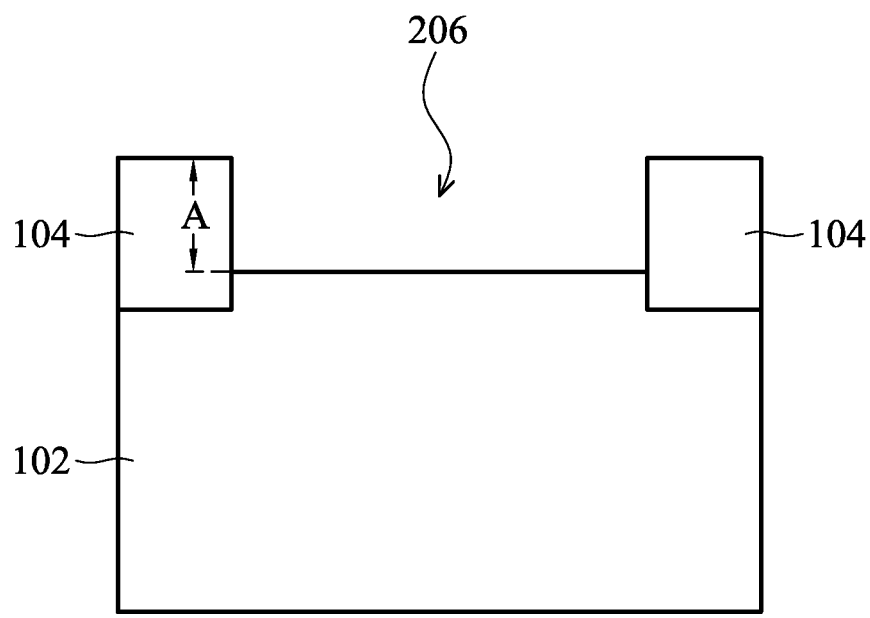

FIG. 2 illustrates a trench 206 formed in the substrate 102 between the isolation regions 104. The trench 206 may be formed using, for example, an isotropic dry etch process. As illustrated in FIG. 2, the isotropic dry etch process removes the substrate 102 from between the isolation regions 104 for a depth A. As will be discussed in greater detail below with reference to FIG. 3, the depth A is controlled such that a ratio of the depth A to a length of a sidewall surface of a subsequently formed recess in the substrate 102 of greater than or equal to 0.5 is maintained.

Figure 3:
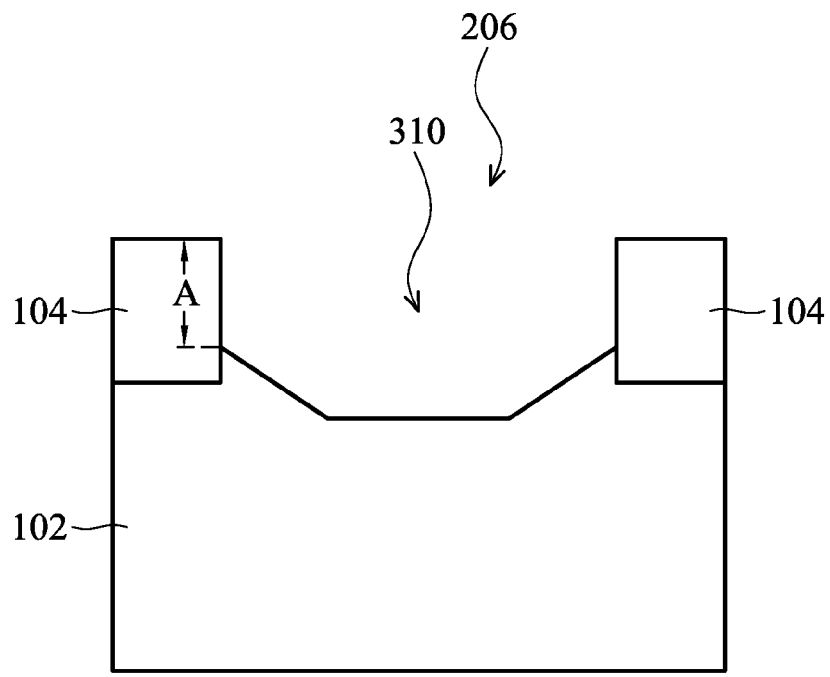

FIG. 3 illustrates a second etch process to form an inverted trapezoidal recess 310 along the bottom of the trench 206 in accordance with an embodiment. As will be discussed in greater detail below, the recess 310 is formed in the substrate 102 such that the substrate 102 along sidewalls of the recess 310 has a {111} surface orientation. To achieve this {111} surface orientation for the recess sidewall, it may be desirable for the substrate 102 to have a (001) surface orientation. Thus, by using a substrate having a (001) crystal orientation and etching to expose the (111) plane of the substrate, the direction and propagation of the dislocations may be controlled to better provide an epitaxial layer with fewer dislocations on the surface.

The second etch process for the trench 206 may be performed using a crystal surface selective anisotropic wet etch process using, for example, tetra-methyl ammonium hydroxide (TMAH) solution in a volume concentration range of 1% to 10% and a temperature range of 15° C. to 50° C. In alternative embodiments, other crystal surface selective wet etching solutions, such as ammonium hydroxide ($NH_3OH$), potassium hydroxide (KOH) or amine-based etching solution may also be used. The selective wet etch results in the {111} surfaces of silicon substrate 102 to be exposed along sidewalls of the trench 206. As illustrated in FIG. 3, this process results in an inverted trapezoidal recess.

Figure 4:
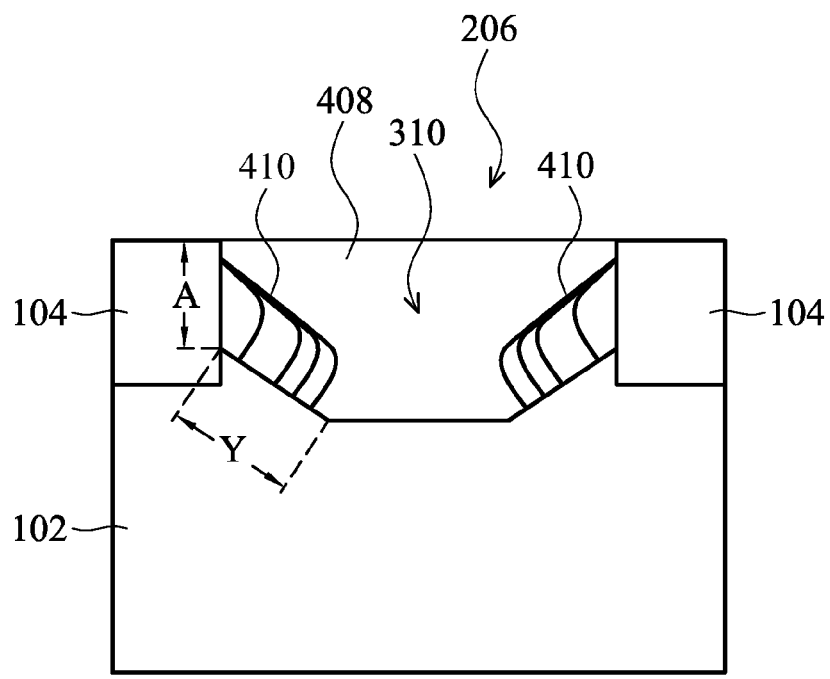

FIG. 4 illustrates an epitaxial growth of a group III-V material 408 in the recess. As illustrated in FIG. 3, threading dislocations (illustrated generally by lines 410) extend in a direction normal to the {111} surface of the sidewalls. In an embodiment in which the group III-V epitaxial layer comprises GaN having a hexagonal crystal structure is grown on a (111) surface of the substrate 102, the threading dislocations 410 of the epitaxial material 408 extends in a (0001) direction of the GaN. When the threading dislocations intersect the (1-101) plane, however, the threading dislocations tend to change direction to the (1-100) direction, which is generally parallel to the {111} surface of the sidewalls of the recess.

Accordingly, the depth A of the trench 206 is chosen to allow the threading dislocations to terminate along sidewalls of the isolation regions 104, thereby providing a surface of the epitaxial material substantially free of threading dislocations. In order to achieve this structure, the depth A has a height that is greater than or equal to one-half the length of the sidewall (distance Y in FIG. 4) of the recess 310.

Figure 5:
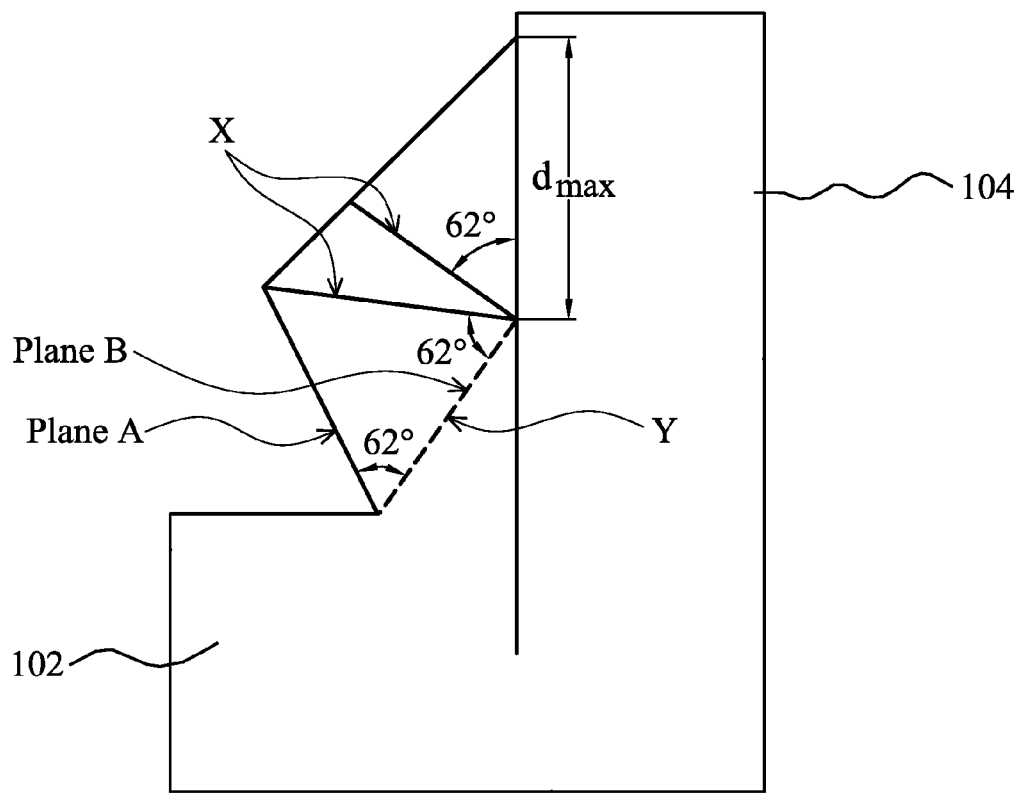
FIG. 5 illustrates geometries of a sidewall of a recess in accordance with an embodiment.

FIG. 5 illustrates the derivation of maximum depth $d_{max}$ (the maximum theoretical value of depth A) in accordance with an embodiment, wherein like reference numerals refer to like elements. Plane A represents the plane (1-101) of the GaN epitaxial layer and plane B represents the plane (0001) of the GaN epitaxial layer. The angle between these two planes is known to be about 62°. Thus, the relationship between $d_{max}$ and the distance X may be determined by the following equation:

$$d_{max} = \frac{X}{\cos(54.7°)} \quad \text{(Eq. 1)}$$

Additionally, $$X = \tan(62°) * 0.5 * Y \quad \text{(Eq. 2)}$$

Thus, combining Equations 1 and 2:

$$d_{max} = \frac{0.5 * Y * \tan(62°)}{\cos(54.7°)} = 1.627 * Y \quad \text{(Eq. 3)}$$

While the theoretical maximum value for the depth A is calculated above, it has been found the growth conditions may be optimized to result in smaller values for depth A. For example, it has been found that by optimizing the etching and growth conditions, values of depth A/Y of between 0.75 and 0.5 may be achieved. Accordingly, in an embodiment, the trench 206 has a depth A such that depth A/Y is greater than or equal to 0.5 with the threading dislocations (410) terminates along sidewalls of the trench 206. In an embodiment, the depth of the recess 310 is controlled to be smaller than about 200 nm by controlling the dry etching depth (etching time) and KOH or TMAH anisotropic etching depth (etching time, solution concentration and temperature). A buffer layer of AlN may be grown in the silicon trench before, for example, a GaN growth at growth temperature of about 1100° C., a pressure of about 100 mbar by using a Group-V source (e.g., $NH_3$) and a Group-III precursor (e.g., trimethylaluminium), maintaining a low V/III ratio of about 650. A GaN may then be grown on the AlN buffer layer at growth temperature of about ~1120° C. and a pressure of about 200 mbar by using a Group-V source (e.g., $NH_3$) and a Group-III precursor (e.g., trimethygalium), maintaining a relatively high VIII ratio of about 1500.

Figure 6:
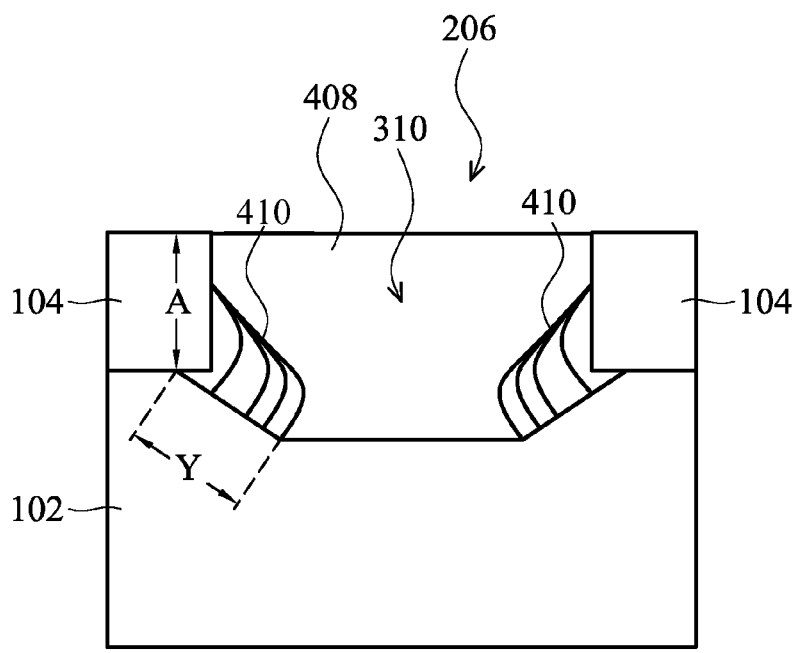
FIG. 6 illustrates another embodiment of a semiconductor device having an inverted trapezoidal recess.

FIG. 6 illustrates another example of an inverted trapezoidal recess. In this example, the depth A extends for the complete thickness of the isolation regions 104. As a result, this embodiment allows for the trench 206, and hence the epitaxial material 408, to extend under the isolation regions 104. The thickness of the isolation regions 104 is adjusted to maintain the ratio described above.

It should be appreciated that the length Y1 of the recess sidewalls determines how propagation of the dislocations 410 toward the surface of the epitaxial layer. Accordingly, the greater the length Y1, the greater the thickness A of the isolation regions 104 to allow a sufficient depth to for the dislocations to terminate at the isolation regions rather than at an upper surface of the epitaxial material 408.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
 a semiconductor substrate having a trench and an inverted trapezoidal recess below the trench, the trench disposed between trench isolation regions, sidewalls of the trench comprising the trench isolation regions, the trench iso- lation regions extending to at least a top of the inverted trapezoidal recess, sidewalls of the inverted trapezoidal recess spaced apart from the trench isolation regions and having a (111) crystal orientation, a ratio of a depth of the trench to a length of the sidewalls of the inverted trapezoidal recess being equal to or greater than 0.5, at least a portion of the inverted trapezoidal recess extending lower than the trench isolation regions; and a group III-V epitaxial layer formed in the trench and the inverted trapezoidal recess;

wherein the inverted trapezoidal recess extends from above a bottommost surface of the trench isolation regions to below the trench isolation regions.

2. The semiconductor device of claim 1, wherein the semiconductor substrate has a (001) crystal orientation.

3. The semiconductor device of claim 1, wherein the group III-V epitaxial layer comprises GaN.

4. The semiconductor device of claim 1, wherein the group III-V epitaxial layer comprises threading dislocations that extend from a first sidewall of the inverted trapezoidal recess and terminate at a first sidewall of the trench; and wherein the first sidewall of the inverted trapezoidal recess and the first sidewall of the trench are disposed at a same side of the group III-V epitaxial layer.

5. A semiconductor device comprising:
a semiconductor substrate;
first trenches filled with a first material formed in the semiconductor substrate;
a second trench in the semiconductor substrate formed between the first trenches, the first trenches extending to at least a bottommost edge of the second trench and forming sidewalls of the second trench;
a recess in the semiconductor substrate below the second trench, the recess having sidewalls with a (111) crystal orientation and having a bottom portion extending between a bottommost edge of the sidewalls of the recess, a depth of the second trench is greater than or equal to one-half of a length of sidewalls of the recess, at least a portion of the recess extending laterally under bottommost surfaces of the first trenches; and
a group III-V epitaxial layer formed in the second trench and the recess.

6. The semiconductor device of claim 5, wherein the first material comprises silicon dioxide.

7. The semiconductor device of claim 5, wherein a bottommost surface of the recess is disposed below the first trenches.

8. The semiconductor device of claim 5, wherein the semiconductor substrate has a (001) crystal orientation.

9. The semiconductor device of claim 5, wherein the group III-V epitaxial layer comprises GaN.

10. The semiconductor device of claim 5, wherein the recess has an inverted trapezoidal shape.

11. The semiconductor device of claim 5, wherein the group III-V epitaxial layer comprises threading dislocations that extend from a first sidewall of the recess and terminate at a first sidewall of the second trench; and wherein the first sidewall of the recess and the first sidewall of the second trench are disposed at a same side of the group III-V epitaxial layer.

12. A method of forming a semiconductor device, the method comprising:
providing a substrate;
forming isolation trenches in the substrate;
performing a first etch process to form a trench having a first depth in the substrate, wherein the first etch is an isotropic etch;
performing a second etch process to form a recess in the substrate in the bottom of the trench and between the isolation trenches, the second etch process exposing (111) facet planes of the substrate, sidewalls of the recess along the (111) facet planes having a second distance and extending from above a bottommost surface of the isolation trenches to below the isolation trenches and the recess having a bottom portion extending between a bottommost edge of the sidewalls of the recess, the first depth being at least one-half of the second distance; and
epitaxially growing a group III-V material in the recess and the trench.

13. The method of claim 12, wherein the group III-V material is GaN.

14. The method of claim 12, wherein forming isolation trenches in the substrate comprises filling the isolation trenches with a first material prior to performing the first etch.

15. The method of claim 14, wherein the isolation trenches have a thickness greater than the first depth.

16. The method of claim 14, wherein the first material is a dielectric material.

17. The method of claim 14, wherein the first material is silicon dioxide.

18. The method of claim 12, wherein the substrate comprises bulk silicon having a surface orientation of (001).

19. The method of claim 12, wherein the performing the second etch process is performed at least in part by etching using a solution of ammonium hydroxide (NH3OH) or tetramethyl ammonium hydroxide (TMAH).

20. The method of claim 12, wherein, after the epitaxially growing the group III-V material, the group III-V material comprises threading dislocations that extend from a first sidewall of the recess and terminate at a first sidewall of the trench; and wherein the first sidewall of the recess and the first sidewall of the trench are disposed at a same side of the group III-V material.

\* \* \* \* \*